US007126208B2

(12) United States Patent
Iwabuchi et al.

(10) Patent No.: US 7,126,208 B2
(45) Date of Patent: Oct. 24, 2006

(54) COMPOSITION FOR FORMING POROUS FILM, POROUS FILM AND METHOD FOR FORMING THE SAME, INTERLEVEL INSULATOR FILM, AND SEMICONDUCTOR DEVICE

(75) Inventors: Motoaki Iwabuchi, Niigata-ken (JP); Fujio Yagihashi, Niigata-ken (JP); Yoshitaka Hamada, Niigata-ken (JP); Hideo Nakagawa, Oumihachiman (JP); Masaru Sasago, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 138 days.

(21) Appl. No.: 10/706,863

(22) Filed: Nov. 12, 2003

(65) Prior Publication Data

US 2004/0232553 A1 Nov. 25, 2004

(30) Foreign Application Priority Data

Nov. 13, 2002 (JP) ............................... 2002-329126

(51) Int. Cl.
*H01L 23/58* (2006.01)
*H01L 21/31* (2006.01)
(52) U.S. Cl. ....................... 257/632; 257/759; 438/781; 438/790
(58) Field of Classification Search ................ 257/758, 257/776, 632, 759; 438/622, 623, 780, 781, 438/790; 430/141
See application file for complete search history.

(56) References Cited

U.S. PATENT DOCUMENTS

| 4,634,509 | A | | 1/1987 | Shimizu et al. | |
|---|---|---|---|---|---|
| 5,494,859 | A | | 2/1996 | Kapoor | |
| 5,707,783 | A | * | 1/1998 | Stauffer et al. | 430/313 |
| 6,037,275 | A | * | 3/2000 | Wu et al. | 438/780 |
| 6,197,913 | B1 | | 3/2001 | Zhong | |

(Continued)

FOREIGN PATENT DOCUMENTS

EP 1223192 7/2002

(Continued)

OTHER PUBLICATIONS

International Search Report From Internartional Applicaion No. PCT/JP03/14438 dated Dec. 15, 2003.

(Continued)

*Primary Examiner*—T. N. Quach
(74) *Attorney, Agent, or Firm*—Alston & Bird LLP

(57) ABSTRACT

Provided are a composition for forming porous film which can form a porous film having practical mechanical strength in a simple and low cost process; a porous film and a method for forming the film; and an inexpensive, high-performing and highly reliable semiconductor device comprising the porous film inside. More specifically, provided is a composition for forming porous film, comprising a polymer which is obtainable by hydrolyzing and condensing one or more silane compounds represented by Formula (1), or preferably by hydrolyzing and co-condensing one or more silane compounds represented by Formula (1) and one more silane compounds represented by Formula (2), Formulas (1) and (2) being:

$$(R^1)_a Si(R^2)_{4-a} \quad (1)$$

$$(R^3)_b Si(R^4)_{4-b} \quad (2)$$

Also provided is a method for forming porous film comprising a step of applying said composition on a substrate to form film and a step of transforming the film into porous film.

8 Claims, 1 Drawing Sheet

U.S. PATENT DOCUMENTS

| | | |
|---|---|---|
| 6,313,045 B1 | 11/2001 | Zhong et al. |
| 6,359,096 B1 | 3/2002 | Zhong et al. |
| 6,376,634 B1 | 4/2002 | Nishikawa et al. |
| 6,391,999 B1 | 5/2002 | Crivello |
| 6,413,647 B1 | 7/2002 | Hayashi et al. |
| 6,512,071 B1 | 1/2003 | Hacker et al. |
| 6,533,855 B1 | 3/2003 | Gaynor et al. |
| 6,534,025 B1 | 3/2003 | Yano et al. |
| 6,596,404 B1 | 7/2003 | Albaugh et al. |
| 6,632,489 B1 | 10/2003 | Watanabe et al. |
| 6,639,015 B1 | 10/2003 | Nakashima et al. |
| 6,696,538 B1 | 2/2004 | Ko et al. |
| 2002/0020327 A1 | 2/2002 | Hayashi et al. |
| 2002/0098279 A1 | 7/2002 | Lyu et al. |
| 2002/0155053 A1 | 10/2002 | Nishiyama et al. |
| 2003/0064321 A1* | 4/2003 | Malik et al. ............. 430/270.1 |
| 2003/0091838 A1 | 5/2003 | Hayahsi et al. |
| 2003/0104225 A1 | 6/2003 | Shiotta et al. |

FOREIGN PATENT DOCUMENTS

| | | |
|---|---|---|
| EP | 1245642 | 10/2002 |
| JP | 63-015355 | 4/1988 |
| JP | 6-145599 | 5/1994 |
| JP | 05-125191 | 5/1996 |
| JP | 09-194298 | 7/1997 |
| JP | 2000-044875 | 2/2000 |
| JP | 2000-309751 | 11/2000 |
| JP | 2000-309753 | 11/2000 |
| JP | 2000-345041 | 12/2000 |
| JP | 2001-002993 | 1/2001 |
| JP | 2001-049178 | 2/2001 |
| JP | 2001-049179 | 2/2001 |
| JP | 2001-055554 * | 2/2001 |
| JP | 2001-55554 | 2/2001 |
| JP | 2001-080915 | 3/2001 |
| JP | 2001-98218 | 4/2001 |
| JP | 2001-115021 | 4/2001 |
| JP | 2001-115028 | 4/2001 |
| JP | 2001-115029 | 4/2001 |
| JP | 2001-130911 | 5/2001 |
| JP | 2001-131479 | 5/2001 |
| JP | 2001-157815 | 6/2001 |
| JP | 2001-164186 | 6/2001 |
| JP | 2001-203197 | 7/2001 |
| JP | 2001-240798 | 9/2001 |
| JP | 2001-354904 | 12/2001 |
| JP | 2002-020688 | 1/2002 |
| JP | 2002-020689 A | 1/2002 |
| JP | 2002-23354 | 1/2002 |
| JP | 2002-030249 A | 1/2002 |
| JP | 2002-038090 A | 2/2002 |
| WO | WO 00/12640 | 3/2000 |
| WO | WO 03/088344 | 10/2003 |

OTHER PUBLICATIONS

Burkett et al., "Synthesis Of Hybrid Inorganic-Organic Mesoporous Silica By-Co-Condensation Of Siloxane And Organosiloxane Precursors," *J. Chem, Soc. Chem. commun.*, 1996, 1367-1368.

Inagaki et al., "Synthesis Of Highly Ordered Mesoporous Materials From A Layered Polysilicate", *J. Chem. Soc. Chem. Commun.*, 1993, pp. 680-682.

* cited by examiner

COMPOSITION FOR FORMING POROUS FILM, POROUS FILM AND METHOD FOR FORMING THE SAME, INTERLEVEL INSULATOR FILM, AND SEMICONDUCTOR DEVICE

CROSS-REFERENCE TO RELATED APPLICATION

The present application claims priority to Japanese Patent Application No. 2002-329126, filed Nov. 13, 2002, the disclosure of which is incorporated herein by reference in its entirely.

BACKGROUND OF THE INVENTION

1. Field of the Invention

The present invention relates to a composition for film formation, which can be formed into a porous film that excels in-dielectric properties, adhesion, film consistency and mechanical strength, and has reduced absorption; a porous film and a method for forming the same; and a semiconductor device, which contains the porous film inside.

2. Description of the Related Art

In the fabrication of semiconductor integrated circuits, as the circuits are packed tighter, an increase in interconnection capacitance, which is a parasitic capacitance between metal interconnections, leads to an increase in interconnection delay time, thereby hindering the enhancement of the performance of semiconductor circuits. The interconnection delay time is called an RC delay, which is in proportion to the product of the electric resistance of the metal interconnections and the capacitance between the interconnections. Reducing the interconnection delay time requires reducing the resistance of metal interconnections or the interconnection capacitance. The reduction in the interconnection capacitance can prevent a densely packed semiconductor device from causing an interconnection delay, thereby realizing faster semiconductor device with reduced power consumption.

One method for reducing interconnection capacitance is to reduce the relative permittivity (dielectric constant) of an interlevel insulator film disposed between metal interconnections. As such an insulator film with a low relative permittivity, it has been considered to use a porous film instead of a silicon oxide film, which has been used conventionally. A porous film can be said to be the only practical film as a material which has potential to have a relative permittivity (dielectric constant) of 2.0 or less, and various methods for forming a porous film have been proposed.

In a first method for forming a porous film as described in Japanese Patent Provisional Publication Nos. 2001-2993, 2001-98218 and 2001-115021, a composition comprising a thermally unstable organic resin component and a siloxane polymer is synthesized, is applied on the substrate to form a coating film, and then treated thermally for decomposing and volatilizing the organic resin component so that a number of pores are formed in the film.

In a second method for forming a porous film as described in Japanese Patent Provisional Publication Nos. 2001-131479 and 2001-80915, it is known to carry out processing as follows: a silica sol solution is applied onto a substrate by coating or using a CVD method so as to form a wet gel; and then the silica sol is subjected to a condensation reaction while restricting volume reduction by controlling the speed of the evaporation of the solvent from the wet gel.

In a third method for forming a porous film as described in WO 00/12640 pamphlet, it is known that a silica micro-particle solution is applied on a substrate to form a coating film, and then the coating film is sintered to form a number of micro-pores between silica micro-particles.

However, these methods have respective major drawbacks as follows.

In the first method for forming a porous film, although the high compatibility between the siloxane polymer and the organic component is required from the coating step to the hardening step in order to make the pores small, there is a problem that the compatibility between the siloxane polymer and the organic resin is poor.

In the second method for forming a porous film, the speed control of the evaporation of the solvent from the wet gel requires a special type of coating device, which increases the cost. In addition, a significant amount of silanol remains on the surface of the micro-pores, which must be silanized because otherwise hygroscopicity is high and the film quality decreases. The silanization makes the process more complicated. In the case where a wet gel is formed by the CVD process, it is necessary to use a special type of CVD device, which is different from the plasma CVD device generally used in the semiconductor process, thereby also increasing the cost.

In the third method for forming a porous film, because the diameter of the pores is determined by the accumulation structure of the silica micro-particles, it becomes very large. This makes it difficult to set the relative permittivity (dielectric constant) of the porous film to 2 or below.

As mentioned above, because the conventional material makes the pore diameter larger during the formation of porous film, there is a problem that the film has difficult in having low dielectric constant. There is also a problem that the cost for forming porous film having fine pores becomes higher. Further, when porous film produced by conventional material is used as an insulator film in multi-level interconnects of the semiconductor device, there is a problem that the mechanical strength required for the semiconductor processing is not obtained.

Thus, when the dielectric constant of the porous film used as an insulator film in multi-level interconnects of the semiconductor device is high, the RC delay increases. Consequently, there is a large problem that the performance of the semiconductor device (high speed and low power consumption) has not been improved. There is also a problem that the low mechanical strength of the porous film leads to the lowered reliability of the semiconductor device.

SUMMARY OF THE INVENTION

The purpose of this invention is to provide a composition for forming porous film which can form a porous film having practical mechanical strength in a simple and low cost process, a method for forming the film and a porous film.

The purpose of this invention is also to provide an inexpensive, high-performing and highly reliable semiconductor device comprising internal porous film having excellent mechanical strength and low dielectric constant which can be produced at a low cost-and is formable by the composition for forming porous film.

Silica-based porous film is formed by removing a thermally decomposable compound from the composition in which a silica precursor and the the thermally decomposable compound called "porogen" are uniformly distributed and finely scattered, while leaving a silica skeleton. The inventors have found that when the compatibility of the silica precursor and the porogen is poor, there are pores having larger diameters or no pores formed due to the shrinkage in the direction of thickness. It is believed that it is because the porogen is not uniformly distributed in the film which has been formed by hardening the silica precursor. It is also believed even if the porogen may have been uniformly distributed in the film, the functional group which is responsible for the compatibility with the porogen decreases so that the porogen phase appears as the silica precursor hardens. Accordingly, it is considered to make the silica precursor be bonded to the group will become the porogen in order to prevent the phase separation of the porogen. However, in the recent semiconductor process, the temperature for the decomposition and volatilization of porogen has been required to be lower and then it becomes necessary to form the silica skeleton at a low temperature. However, the silica precursor that has been bonded to the porogen has difficulty in being hardened and does not become porous because the temperature for hardening the silica precursor is higher than the decomposition temperature of the porogen.

On the other hand, the silica precursor typically contains Si—OH and Si—O(alkyl) wherein the alkyl means a alkyl group and forms a siloxane network through hydrolysis and dehydration condensation as shown below. It is found that the condensation requires as high as 250° C. or more without catalyst, and it is carried out more effectively at the lower temperature in the presence of acid or base catalyst so that the film having high hardness can be formed. However, when the acid or base catalyst is added to the composition, the condensation reaction can progress even below room temperature. Thus, there is a problem that the storage stability of the composition is damaged remarkably.

The inventors have solved the problem by adding to the composition an acid or base generator for generating the acid or base by the thermal decomposition. More specifically, they have found that hydrolysis of alkoxysilane and condensation of silanol as shown in Formulas (6) and (7) are accelerated by acid or base catalyst generated by thermal decomposition so that the formation of silica skeleton is completed below the decomposition temperature of the porogen. They have also found that because the acid and base generator for generating the acid or base by its thermal decomposition is neutral before the decomposition, it does not adversely affect the storage stability of the composition comprising the silica precursor.

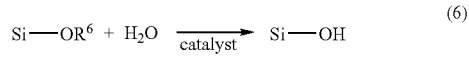  (6)

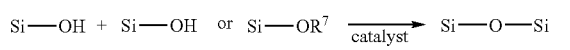  (7)

wherein $R^6$ represents a monovalent hydrocarbon group which may be substituted or unsubstituted; $R^7$ represents a monovalent hydrocarbon group which may be substituted or unsubstituted and which may be same as or different from $R^6$ of the Equation (6).

Based on these findings, according to the invention, provided is a composition for forming film in which the acid or base generator for generating acid or base by its thermal decomposition (hereinafter, referred to as the acid or base generator or as Component (B)) is added to a composition comprising a chemically modified silica precursor by being bonded to the porogen and an unmodified silica precursor. Provided also is a method for forming porous film comprising a step of applying said composition on a substrate to form a film and a step of heating the film at or above the decomposition temperature of Component (B), preferably at or above the decomposition temperature of monovalent hydrocarbon group of the hydrolysate of silane compound represented by Formula (2) below wherein the monovalent group may be a long chain alkyl group which may be substituted or non-substituted.

The hydrolysate of the hydrolysable silane (hereinafter, referred to also as Component (B)) is a polymer which is obtainable by hydrolyzing and condensing one or more silane compounds represented by Formula (1):

  (1)

wherein $R^1$ represents a straight chain or branched monovalent hydrocarbon having 6 to 20 carbons which may be substituted or unsubstituted and when there are $R^1$s, the $R^1$s each may be independently same or different; $R^2$ represents a hydrolysable group and when there are $R^2$s, the $R^2$s each may be independently same or different; and a is an integer of 1 to 3.

Component (A) to be used in the invention may be preferably a polymer having number-average molecular weight of 100 or more which is obtainable by hydrolyzing and co-condensing one or more silane compounds represented by Formula (1) and one more silane compounds represented by Formula (2):

  (2)

wherein $R^3$ represents a straight chain or branched monovalent hydrocarbon having 1 to 5 carbons which may be substituted or unsubstituted and when there are $R^3$s, the $R^3$s each may be independently same or different; $R^4$ represents a hydrolysable group and when there are $R^4$s, the $R^4$s each may be independently same or different; and b is an integer of 0 to 3.

According to the invention, a method for producing a composition for forming film is provided as well as porous film.

According to the invention, a semiconductor device comprising an internal porous film formed by a composition comprising a silane polymer and an acid or base generator for generating acid or base by its thermal decomposition is provided.

The silane polymer may be preferably polymer obtainable by hydrolyzing and condensing one or more silane compounds represented by Formula (1):

  (1)

wherein $R^1$ represents a straight chain or branched monovalent hydrocarbon having 6 to 20 carbons which may be substituted or unsubstituted and when there are $R^1$s, the $R^1$s each may be independently same or different; $R^2$ represents a hydrolysable group and when there are $R^2$s, the $R^2$s each may be independently same or different; and a is an integer of 1 to 3.

Consequently, the semiconductor device comprising the inexpensive porous film having high mechanical strength and low dielectric constant can be provided.

The silane polymer may be preferably polymer obtainable by hydrolyzing and co-condensing one or more silane compounds represented by Formula (1) and one more silane compounds represented by Formula (2), Formulas (1) and (2) being:

$$(R^1)_a Si(R^2)_{4-a} \quad (1)$$

$$(R^3)_b Si(R^4)_{4-b} \quad (2)$$

wherein $R^1$ represents a straight chain or branched monovalent hydrocarbon having 6 to 20 carbons which may be substituted or unsubstituted and when there are $R^1$s, the $R^1$s each may be independently same or different; $R^2$ represents a hydrolysable group and when there are $R^2$s, the $R^2$s each may be independently same or different; and a is an integer of 1 to 3; $R^3$ represents a straight chain or branched monovalent hydrocarbon having 1 to 5 carbons which may be substituted or unsubstituted and when there are $R^3$s, the $R^3$s each may be independently same or different; $R^4$ represents a hydrolysable group and when there are $R^4$s, the $R^4$s each may be independently same or different; and b is an integer of 0 to 3.

The silane polymer may be preferably a hydrolysate having number-average molecular weight of 100 or more and comprising a silanol group, and in said polymer 30 to 80 mol % of structural units derived from said silane compound represented by Formula (2) is represented by Formula (3):

$$Si(OH)_c(R^5)_{4-c} \quad (3)$$

wherein $R^5$ represents a siloxane residue or $R^3$, and c is an integer of 1 or 2.

Consequently, the semiconductor device comprising the inexpensive porous film having high mechanical strength and low dielectric constant can be provided.

The decomposition temperature of said acid or base generator may preferably lower than that of $R^1$ of said polymer. Further, the acid or base generator may preferably have decomposition temperature of 250° C. or less. Consequently, the semiconductor device comprising the inexpensive porous film having high mechanical strength and low dielectric constant can be provided.

The acid or base generator may be preferably a diazo compound represented by Formula (4) or (5):

wherein R and $R^1$ each independently represents an alkyl group, an aromatic group, an aralkyl group or a fluoroalkyl group and R and $R^1$ may be same or different.

When the diazo compound represented by Formula (4) or (5) is used as the acid or base generator, it can decompose at lower temperature than the decomposition temperature of $R^1$ of the silane polymer which is obtained through hydrolysis and condensation.

According to the semiconductor device of the invention, the semiconductor device comprising the multi-level interconnects containing an internal porous film securing the mechanical strength and having low dielectric constant can be realized. Because of lower dielectric constant of the insulator film, the parasitic capacitance of the area around the multi-level interconnects is decreased, leading to the high-speed operation and low power consumption of the semiconductor device. The increased mechanical strength of the film can enhance the reliability of the semiconductor device.

Moreover, in the semiconductor device of the invention, the porous film may be preferably between metal interconnections in a same layer of multi-level interconnects, or may be between upper and lower metal interconnection layers. Consequently, high-performing and highly reliable semiconductor can be realized.

The use of the composition for forming porous film of the invention can provide porous film having low dielectric constant, being flat and uniform, and having high mechanical strength. The porous film is best suitable for the insulator film of the semiconductor device. In addition, use of the porous film formable by the composition of the invention as the insulator film of the multi-level interconnects can achieve a high-performing and highly reliable semiconductor device.

DETAILED DESCRIPTION OF THE PREFERRED EMBODIMENTS

Figure 1:
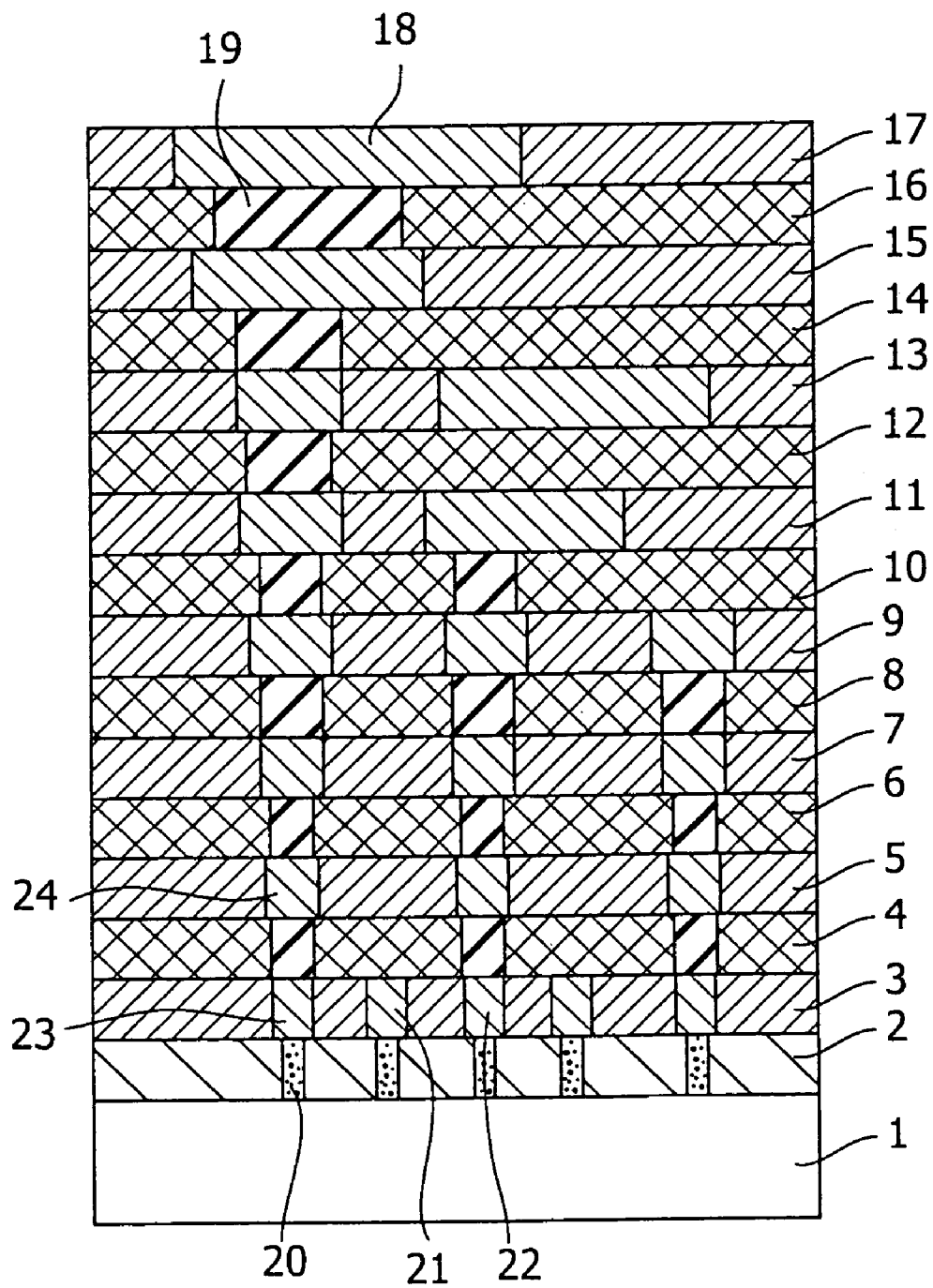
FIG. 1 is a schematic cross-sectional view of a semiconductor device of the invention.

The invention will be explained in detail below.

In Formula (1), $R^1$ is a straight chain or branched monovalent hydrocarbon having 6 to 20 carbons which may be substituted or unsubstituted. When the number of carbon atoms is less than six, dielectric constant of the formed film may not be low. When the number of carbon atoms exceeds 20, the film formation may be difficult because of difficulty in being hardened. The types of monovalent hydrocarbon group (alkyl group) may not be especially limited, but preferably a secondary or tertiary alkyl group, more preferably a tertiary alkyl group because of ease of decomposition.

In Formula (2), the monovalent group for $R^3$ may be preferably a group having 1 to 6 carbons and may include alkyl, aryl, aralkyl, alkenyl groups, and the hydrogen atoms included in said groups being partially or entirely substituted with a halogen atom such as a fluorine atom, a epoxy-containing group such as a glycidyl group or glycidyloxy group, or an amino group. The monovalent group for $R^3$ may be more preferably a group having 1 to 3 carbons such as methyl, ethyl and propyl groups.

In Formulas (1) and (2), the hydrolysable group of $R^2$ and $R^4$ may include a halogen atom, alkoxy, acyloxy, oxime and amino groups, preferably an alkoxy group having 1 to 6 carbons, and particularly preferably methoxy, ethoxy and isopropoxy groups in view of ease in control of hydrolysis and condensation reactions.

The silane compound represented by Formula (1) may include hexyltrimethoxysilane, hexylmethyldimethoxysilane, 1-methylpentyl trimethoxysilane, 1-ethylbutyltrimethoxysilane, tert-hexyltrimethoxysilane, thexyltrimethoxysilane, cyclohexyltrimethoxysilane, 2-cyclohexylethyltrimethoxysilane, butyltrimethoxysilane, decyltrimethoxysilane, dodecanyltrimethoxysilane, tetradecanyltrimethoxysilane, hexadecanyltrimethoxysilane, octadecanyltrimethoxysilane and eicosanyltrimethoxysilane.

The silane compounds represented by Formula (2) may include tetramethoxysilane, tetraethoxysilane, tetrapropoxysilane, tetrachlorosilane, trichlorosilane, trimethoxysilane, triethoxysilane, tripropoxysilane, methyltrichlorosilane, methyltrimethoxysilane, methyltriethoxysilane, methyltripropoxysilane, ethyltrichlorosilane, ethyltrimethoxysilane, ethyltriethoxysilane, propyltrichlorosilane, propyltrimethoxysilane, phenyltrichlorosilane, phenyltrimethoxysilane, phenyltriethoxysilane, dimethyldimethoxysilane, dimethyldiethoxysilane, dimethyldichlorosilane, methyldimethoxysilane, methyldiethoxysilane, methyldichlorosilane, phenylmethyldimethoxysilane, phenylmethyldiethoxysilane, phenylmethyldichlorosilane, diphenyldimethoxysilane, diphenyldiethoxysilane, diphenyldichlorosilane, trimethylmethoxysilane and trimethylchlorosilane.

Next, in the Component (A), the structure of polymer obtainable from the silane compounds represented by Formulas (1) and (2) will be explained. In order to form uniform film the silanol group-containing hydrolysate may preferably have the molecular weight higher than a certain value. According to the invention, the polymer of the silanol group-containing hydrolysate being obtainable from the silane compounds represented by Formulas (1) and (2) and having the number-average molecular weight of 100 or more may be preferably comprised in the composition. The number-average molecular weight of the polymer formed by hydrolyzing and co-condensing the silane compounds represented by Formulas (1) and (2) may be measured with gel permeation chromatography (GPC) using polystyrene as a standard. When the number-average molecular weight of the polymer is less than 100, it may be difficult to form uniform film and possible to have poor storage stability because an appropriate cross-linking of the polymer may not be formed. The number-average molecular weight may be preferably 500 to 10,000, more preferably 1,000 to 5,000 in view of the viscosity suitable for the coating.

Preferably, the polymer obtainable by hydrolyzing and co-condensing the silane compounds represented by Formulas (1) and (2) may be a silanol group-containing hydrolysate having number-average molecular weight of 100 or more, and 30 to 80 mol % of structural units derived from said silane compound represented by Formula (2) is represented by Formula (3):

$$Si(OH)_c(R^5)_{4-c} \qquad (3)$$

wherein $R^5$ represents a siloxane residue or $R^3$, and c is an integer of 1 or 2.

The semiconductor device comprising the internal porous film obtainable from the composition for forming porous film comprising this silanol group-containing hydrolysate e porous film of low dielectric constant becomes a semiconductor device comprising the inexpensive porous film having high mechanical strength and low dielectric constant.

The mole ratio of the silane compounds represented by Formulas (1) and (2) may be (1)/(2)=100/0 to 10/90, more preferably 80/20 to 20/80. When the portion of the silane compound represented by Formula (1) is less than 10 mol %, the dielectric constant may be insufficient so that 20 mole % or more may be preferably in view of formation of film having lower dielectric constant. In addition, although the silane compound represented in Formula (2) is not always comprised, it may be preferably comprised at the amount of 20 mol % or more because it can enhance the hardenability.

Although the silane compounds represented by Formula (2) having units of M, D, T and Q units may be optionally combined, the presence of unit T or Q may be preferred in view of high mechanical strength of the film. The unit M, D, T or Q means a siloxy group having 1, 2, 3 or 4 oxygen atoms which directly bonded with the Si atom, respectively. In addition, the number of the remaining siloxy group after the hydrolysis of the silane compound is indicated by the number following M, D, T or Q. For example, D1 comprises one remaining siloxy group after the silane compound comprising two siloxy groups are hydrolyzed.

The content of the silanol group-containing unit represented by Formula (3) (hereinafter D1+T1+T2+Q2+Q3 unit) in the polymer obtainable by hydrolyzing and co-condensing one or more silane compounds represented by Formulas (1) and one or more silane compounds represented by (2) may be 30 to 80 mol % of the hydrolysis component of the silane compound represented by Formula (2). When it is more than 80 mol %, the storage stability may decrease extremely. When it is less than 30 mol %, the hardenability may decrease.

The silanol group-containing hydrolysis component obtainable from the silane compound represented by Formula (2) may be obtained by hydrolysis of the silane compound by excess water. When the hydrolysis is carried out under a hydrophilic condition being substantially and almost free of an organic solvent, the specific silanol group-containing hydrolysate comprising a large portion of D1, T1, T2, Q1, Q2 and Q3 units-is obtained.

This silanol group-hydrolysate may be prepared by the following steps.

In a first step, various kinds of silane compounds are hydrolyzed and condensed preferably in an aqueous solution having a pH value of 1 to 7. The amount of water used for the hydrolysis may be 50 to 5,000 parts by weight based on the 100 parts by weight of silane compound or a mixture of the silane compounds which satisfy said requirement. When the amount of water is less than 50 parts by weight, the water may be insufficient so that the control of the reactivity of the silanol group may be difficult and the structural contribution may be impossible. When the amount of water is greater than 5,000 parts by weight, the concentration of the silane may be too low so that the rate of condensation reaction may become slower.

The hydrolysis may be carried out by adding the silane compound to the aqueous solution and stirring the mixture. A hydrolysis catalyst may be added thereto to promote the hydrolysis, particularly the initial hydrolysis. The hydrolysis catalyst can be added to the aqueous solution before the addition of the silane compound or be added to the dispersion liquid in which the silane compound has been dispersed.

The hydrolysis catalyst may include a conventional catalyst. It may be preferable that the solution containing the catalyst has an acidic pH value of 1 to 7. In particular, acidic hydrogen halide, carboxylic acid, sulfonic acid, an acidic or weakly acidic inorganic salt, and solid-acid such as ion exchange resin may be preferred as catalysts for hydrolysis. The examples may include inorganic acid such as hydrofluoric acid, hydrochloric acid, nitric acid and sulfuric acid; organic acid such as acetic acid, maleic acid and trifluoroacetic acid; sulfonic acid such as methanesulfonic acid, p-toluenesulfonic acid and tri-fluoromethanesulfonic acid; and a cation exchange resin containing a sulfonic acid group or a carboxylic acid group on the surface thereof.

The catalyst may added in an amount of 0.001 to 10 mol % based on one mol of hydrolysable group on the silicon atom. Under a strongly acidic condition such as at a pH value of less than 1, or under an alkali condition such as at a pH value of more than 7, the silanol group may become extremely unstable. The more preferable pH of the aqueous solution to be used may be 2 to 6. The amount of water is large excess on basis of the hydrolysable group so that hydrolysis can be carried out completely. The agitation of solution under the above condition at room temperature or at heating temperature may lead to the easy condensation of the silanol groups.

The aqueous solution can be stirred at the room temperature but it may overheat during stirring.

At this stage, a hydrolysis by-product such as alcohol exists in the aqueous solution so that the silane reaction mixture, which is a precursor of the silanol group-containing hydrolysate, is dissolved in the solution.

In a second step, the hydrolysis by-product is removed from the reaction mixture solution, and as a result, the silanol group-containing hydrolysate and water are chiefly comprised in the system. Thus, the hydrolysis by-product such as alcohol is removed by distillation from the silane reaction mixture solution obtained in the first step so that the system is converted to be one substantially comprising the silanol group-containing hydrolysate and water. The hydrolysis by-product such as alcohol is removed so that the silanol group-containing hydrolysate is no longer dissolved in the solution. Consequently, the solution becomes slightly impure or cloudy. After 50 to 100% of the by-product is removed, the silanol group-containing hydrolysate becomes undissolvable in the aqueous phase so that it precipitates after left stand.

The silanol group-containing hydrolysate separated from said aqueous phase can be isolated. Alternatively, an organic solvent which is not uniformly miscible with water can be added to the solution so that the solution of the silanol group-containing hydrolysate can be separated from the aqueous phase. The organic solvent may include diethyl ether, diisopropyl ether, methyl isobutyl ketone, ethyl acetate, n-butyl acetate, isobutyl acetate, benzene, toluene and xylene. It may be used singly or in an admixture of two or more.

The method for hydrolyzing the silane compound represented by Formula (1) may not be particularly limited. The preferable method may comprise a step of hydrolyzing the silane compound represented by Formula (1) in said or well-known process, and then a step of adding the silane compound represented by Formula (2) thereto for further hydrolysis. Alternatively, another preferable method may comprise a step of co-hydrolyzing the silane compound represented by Formulas (1) and (2). In the preferable methods, a uniform composition is obtained.

The silanol group-containing hydrolysate used in the invention can be formed by the abovementioned methods. However, any production method can be used as long as it does not contradict the matters described above. Thus, the production method may not be particularly limited.

Moreover, of an acid or base generator for generating acid or base by its thermal decompotion used in the invention, the acid generator may include a diazo compound represented by Formulas (4) or (5):

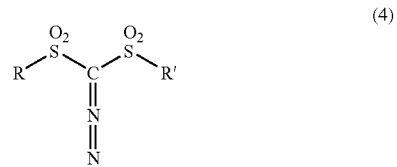

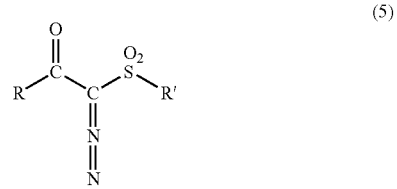

wherein R and R' each represents an alkyl group, an aromatic group, an aralkyl group or a fluoroalkyl group and R and R' may be same or different.

The examples may include those described below.

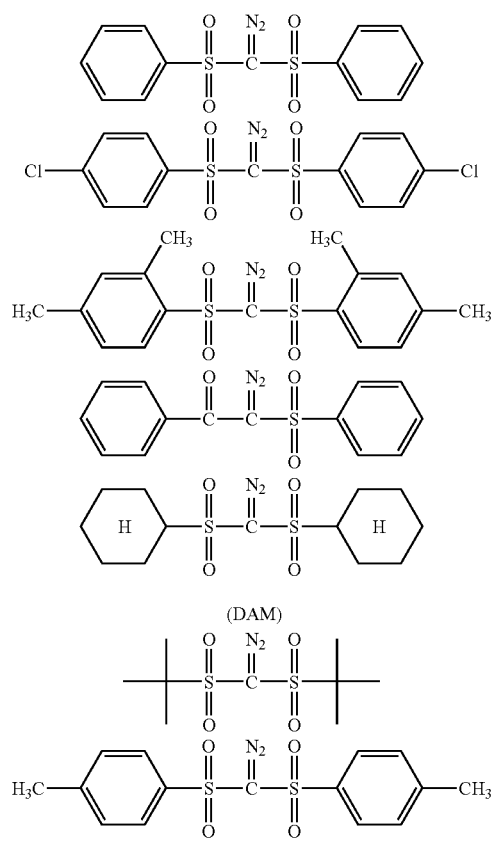

The acid or base generator for generating acid or base by its thermal decomposition may preferably have decomposition temperature lower than the decomposition temperature of $R^1$ of said polymer obtainable by hydrolysis and condensation. The acid or base generator may preferably have decomposition temperature of 250° C. or less, more preferably 80 to 250° C. When the decomposition temperature is less than 80° C., the hardening may not progress sufficiently due to the presence of the solvent or the volatile component.

When the decomposition temperature is more than 250° C., the decomposition of $R^1$ may start.

When the diazo compound represented by Formula (4) or (5) is used as an acid or base generator, it may decompose at lower temperature than the decomposition temperature of $R^1$ of the silane compound formed by hydrolysis and condensation.

The acid or base generator may be comprised in 0.01 to 10, preferably 0.1 to 10 parts by weight, more preferably 1 to 5 parts by weight on basis of 100 parts by weight of the polysiloxane solid. When the amount of the acid or base generator is insufficient, the construction of silica skeleton may not progress effectively at low temperature and the pores may collapse or swell. When the amount of the acid or base generator is too high, the cost may be high and the decomposed residue may not be easily removed by volatilization. The polysiloxane solid content is obtained by calculating the amount of $(R^1)_a Si(R^2)_{(4-a)}$ as that of $(R_1)_a SiO_{(4-a)/2}$ and the amount of $(R^3)_b Si(R^4)_{(4-b)}$ as that of $(R^3)_b SiO_{(4-b)/2}$.

The composition of the invention can be diluted by solvent. Preferred solvent may include aliphatic hydrocarbon such as n-pentane, isopentane, n-hexane, isohexane, n-heptane, 2,2,2-trimethylpentane, n-octane, isooctane, cyclohexane and methylcyclohexane; aromatic hydrocarbon such as benzene, toluene, xylene, ethylbenzene, trimethylbenzene, methylethyl benzene, n-propylbenzene, isopropylbenzene, diethylbenzene, isobutylbenzene, triethylbenzene, diisopropylbenzene and n-amylnaphthalene; ketone such as acetone, methyl ethyl ketone, methyl n-propyl ketone, methyl n-butyl ketone, methyl isobutyl ketone, trimathylnonanone, cyclohexanone, 2-hexanone, methylcyclohexanone, 2,4-pentanedione, acetonylacetone, diacetone alcohol, acetophenone and fenthion; ether such as ethyl ether, isopropyl ether, -butyl ether, n-hexyl ether, 2-ethyl hexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether and dipropylene glycol dibutyl ether; ester such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethylether acetate, dipropylene glycol monoethyl ether acetate, dipropylene glycol mono-n-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvent such as N-methylformamide, N,N-dimethylformamide, acetamide, N-methylacetamide, N,N-dimethylacetamideN-methylpropionamido and N-methylpyrrolidone; sulfur-containing solvent such as dimethyl sulfide, diethyl sulfide, thiophene, tetrahydrothiophene, dimethylsulfoxide, sulfolane- and 1,3-propanesultone. It may be used singly or in an admixture of two or more.

The solvent may be typically added so that the solvent becomes 50 to 95% by weight although the extent of dilution may differ depending on the viscosity and the target film thickness.

The film can be produced from the composition for forming porous film of the invention in the method comprising a step of coating a substrate with the composition to form step. The substrate which the composition of the invention can be applied on may include a semiconductor, glass, ceramic and metal. Any coating method which can be used for the production of the semiconductor device may be used. Examples of the coating method may include spin coating, dipping and roller blade. The film thickness may be typically 0.1 to 2 μm for the interlevel insulating film. Then, there is a step of heating the film, which is usually called "prebake". The object of the step may to evaporate the solvent in the coating liquid and to fix the shape of the coating film. The heating temperature at this time may be the temperature high enough to evaporate the solvent. It may be preferable that the solvent is removed at 80 to 200° C. for several minutes.

The film formed is subjected to the first heating step at temperature at which Component (B) decomposes to generate acid or base but the alkyl group having 6 to 20 carbons of Component (A) hardly decomposes. Consequently, acid-catalyzed condensation of Component (A) and the formation of silica skeleton are almost completed. Then, the film is subjected to the second heating step at temperature which is high enough to decompose and evaporate the alkyl group having 6 to 20 carbons of Component (A). Consequently, the hardened film having pores can be formed.

According to the composition of the invention, 250° C. for the first step and 200 to 400° C. for the second step may be preferable so that the film having pores are produced. The heating time for the first step may be 0.1 minute to 1 hour, more preferably 1 to 5 minutes. The heating time for the second step may be 1 minute to 1 hour, more preferably 1 to 5 minutes. The third heating step at 400 to 500° C. for 1 hour may be preferably added for ensuring the removal of the thermally decomposition residue. When the heating temperature is too low, the hardening of Component (A) or the decomposition and evaporation of Component (B) do not progress sot that the film may have poor mechanical strength due to insufficient hardening. When the temperature is too high, Composition (A) is excessively decomposed so that the film strength may be lowered. The too high temperature may not be suitable for the semiconductor device manufacturing process.

The heating atmosphere such as air or an inert may affect the distribution of pores and mechanical strength. Accordingly, the physical properties of film can be controlled by controlling the heating atmosphere. Thus, the heating atmosphere is not particularly limited. Examples of inert gases may include nitrogen and argon gases. According to the invention, the inert gas may be preferably selected so that the oxygen concentration is 5 ppm or less. The heating in an inert gas may produce the film having even lower dielectric constant with the influence of oxygen excluded.

Moreover, according to the method for forming film of the invention, the second step of heating may be preferably carried out under reduced pressure so that the dielectric constant of the produced film may be lowered because the decomposition and evaporation of Component (B) is promoted and the influence of oxygen is excluded.

The porous film of the present invention is particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity of the interlevel insulator film disposed between metal interconnections. When an interlevel insulator film is prepared by using the composition for forming a porous film of the present invention, the semiconductor device can be downsized and faster and consume less power.

However, there is a problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process, which is generally used in the fabrication process. Particularly, when used as the interlevel insulator film of a semiconductor, the porous film of the invention having high mechanical strength despite the porosity prevents such exfoliation. Consequently, reliability of the semiconductor produced can be largely improved.

The embodiments of the semiconductor device of the present invention will be described below. FIG. 1 shows a schematic cross-sectional view of an example of the semiconductor device of the present invention.

In FIG. 1, the substrate 1 is an Si semiconductor substrate such as an Si substrate or an SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7, and M8, respectively. The via layers corresponding to the lowermost interlevel insulator film 4 through the uppermost insulator film 16 are abbreviated as V1, V2, V3, V4, V5, V6, and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multilayer interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers or the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film with a low relative permittivity of the present invention as a via layer can greatly reduce the capacitance between the upper and lower metal interconnection layers. Therefore, using the porous film of the present invention for all of the interconnection layers and the via layers can greatly reduce the parasitic capacitance of the interconnections. The use of the porous film of the invention as an insulator of the interconnections can prevent the conventional problem of increased dielectric constant due to the moisture absorption by the porous film during the lamination of porous films for forming multi-level interconnections. Consequently, the high speed performance and less power operation of the semiconductor can be realized.

Because the porous film to the invention has high mechanical strength, the mechanical strength of the semiconductor device can be improved, thereby greatly improving the yield of the fabrication and the reliability of the semiconductor device.

The invention will be described specifically through the following synthetic examples, examples and comparative examples, but is not limited to the examples.

SYNTHETIC EXAMPLE 1

In a 2 liter flask placed were placed 6.9 g. of 60% nitric acid, 13.7 g of isopropyl alcohol, 1233 g of methyl isobutyl ketone (MIBK) and 206 g (1.0 mol) of thexyltrimethoxysilane. The 40.5 g (2.25 mol) of water was added thereto and hydrolysis was carried out. After methanol as a by-product was evaporated, 30 g of an aqueous 10% NaOH solution was added and the condensation reaction was carried out. The aqueous phase was separated and the polysiloxane solution containing 53 g solid portion was obtained. The number-average molecular weight of this hydrolysate was 1350.

SYNTHETIC EXAMPLE 2

The 559 g of acidic water having nitric acid was placed in a 2 liter flask. The 155 g (0.75 mol) of thexyltrimethoxysilane and 34 g of methyltrimethoxysilane were added dropwise thereto and hydrolysis was carried out at 25° C. Next, methyl isobutyl ketone was added thereto and methanol was evaporated. The aqueous phase was separated from the remaining solution and the polysiloxane solution containing 87 g solid portion was obtained. According to $^{29}$Si-NMR analysis of this silanol group-containing hydrolysate, Unit $MeSiO_{3/2}$ (hereafter, Me refers to methyl group) contained 6 mol % of Unit T-1, 62 mol % of Unit T-2 and 32 mol % of Unit T-3 and the number-average molecular weight of this silanol group-containing hydrolysate was 1500. Furthermore, according to $^1$H-NMR analysis, the ratio of Me-SiOMe/SiMe was less than 0.01.

It is noted that the ratio of Me-SiOMe/SiMe means in Me-SiOMe the ratio of three protons of the methoxy group bonded to Si to three protons of the methyl group bonded to Si. Although the three protons of the methoxy group bonded to Si disappear as hydrolysis or polymerization progresses, three protons of the methyl group bonded to Si remain. Therefore, the ratio of Me-SiOMe/SiMe becomes smaller as the hydrolysis or polymerization progresses.

SYNTHETIC EXAMPLE 3

In a 1 liter flask were placed 354 g of propylene glycol monomethyl ether acetate, 155 g (0.75 mol) of thexyltrimethoxysilane and 34 g (0.25 mol) of methyltrimethoxysilane. The 66.9 g of 6% nitric acid was added thereto and hydrolysis was carried out. After methanol as a by-product was evaporated, the aqueous phase was separated. Consequently, the polysiloxane solution containing 83.6 g solid portion was obtained. According to $^{29}$Si-NMR analysis of the hydrolysate, 12 mol % of Unit T-1, 67 mol % of Unit T-2 and 22 mol % of Unit T-3 were contained in MeSiO$_{3/2}$. The number-average molecular-weight of this silanol group hydrolysate was 1880. Moreover, according to $^1$H-NMR analysis, the ration of Me-SiOMe/SiMe was 0.64.

SYNTHETIC EXAMPLE 4

In a 1 liter flask were placed 354 g of propylene glycol monomethyl ether acetate, 52 g (0.25 mol) of thexyltrimethoxysilane and 102 g (0.75 mol) of methyltrimethoxysilane. The 66.9 g of 6% nitric acid was added thereto and hydrolysis was carried out. After methanol as a by-product was evaporated, the aqueous phase was separated. The polysiloxane solution containing 77.5 g solid portion was obtained. According to $^{29}$Si-NMR analysis of this hydrolysate, MeSiO3/2 contained 9 mol % of Unit T-1, 65 mol % of Unit T-2 and 26 mol % of Unit T-3. The number-average molecular weight of this silanol group-containing hydrolysate was 5800. Moreover, according to $^1$H-NMR analysis, the ratio of Me-SiOMe/SiMe was 0.60.

SYNTHETIC EXAMPLE 5

In a 1 liter flask were placed 354 g of propylene glycol monomethyl ether acetate, 66 g (0.25 mol) of n-decyl trimethoxysilane and 102 g (0.75 mol) of methyltrimethoxysilane. The 66.9 g of 6% nitric acid was added thereto and hydrolysis was carried out. After methanol as a by-product was evaporated, water phase was separated and the polysiloxane solution containing 88.5 g solid portion was obtained. According to $^{29}$Si-NMR analysis of this hydrolysate, MeSiO$_{3/2}$ contained 18 mol % of Unit T-1, 66 mol % of Unit T-2 and 16 mol % of Unit T-3. The number-average molecular weight of this silanol group-containing hydrolysate was 2000. Moreover, according to $^1$H-NMR analysis, the ratio of Me-SiOMe/SiMe was 0.67.

SYNTHETIC EXAMPLE 6

The 559 g of acidic water containing nitric acid was placed in a 2 l flask. The 292 g (2.15 mol) of methyltrimethoxysilane was added dropwise thereto at 25° C. and hydrolysis was carried out. Next, methyl isobutyl ketone was added thereto and methanol was evaporated. The aqueous phase was separated from the remaining solution and the polysiloxane solution containing 130 g solid portion was obtained.

SYNTHETIC EXAMPLE 7

The 354 g of propylene glycol monomethyl ether acetate, 45 g (0.25 mol) of isobutyl trimethoxysilane and 102 g (0.75 mol) of methyltrimethoxysilane were placed in a 1 liter flask. The 66.9 g of 6% nitric acid was added thereto and hydrolysis was carried out. After methanol as a by-product was evaporated, the aqueous phase was separated. The polysiloxane solution containing 69.5 g solid portion was obtained.

EXAMPLE AND COMPARATIVE EXAMPLE

The DAM, which is a compound having cyclohexy groups as R and R' of Formula (4), was added as an acid generator to the composition produced in Synthetic Examples as shown Table 1. The resulting compostion was applied on a silicon wafer with a spin-coater to form film, which was then dried in air. Then, the film was heated at 120° C. for 1 min and then at 250° C. for 10 min. Further, it was heated at 400° C. for 60 minutes under a nitrogen gas stream. The coating condition was 1,000 to 3,000 rpm of one minute. The dielectric constant of the film was measured using an automatic mercury probe manufactured by Japan SSM Company. The modulus and hardness of the film was measured with Nanoindentor of MTS Systems Company. The refractive index was measured with ellipsometer SD2300LA made by PLAS MOS Company. The average pore size was measured with Tristar produced by Shimazu Company.

The DAM and oxalic acid were added to the composition produced in Synthetic Examples as shown in Table 2. The time-wise change of number-average molecular weight at room temperature was measured with the GPC8120 produced by Toso Co. Ltd.

TABLE 1

| | | component | | DAM (vs polysiloxane solid portion) | ease of film formation | modulus | hardness | dielectric constant | average pore size |
|---|---|---|---|---|---|---|---|---|---|
| | composition | MeSiO$_{3/2}$ | RSiO$_{3/2}$ | (wt %) | (with eye) | (Gpa) | (Gpa) | 1 MHz | (nm) |
| Ex. 1 | Syn. Ex. 1 | 0 | 100 (R = thexyl) | 2 | good | 3.2 | 0.3 | 2.3 | 10 |
| Ex. 2 | Syn. Ex. 2 | 25 | 75 (R = thexyl) | 2 | good | 5.0 | 0.4 | 2.4 | 12 |
| Ex. 3 | Syn. Ex. 3 | 25 | 75 (R = thexyl) | 2 | good | 3.9 | 0.3 | 2.4 | 10 |
| Ex. 4 | Syn. Ex. 4 | 75 | 25 (R = thexyl) | 2 | good | 4.5 | 0.5 | 2.4 | 10 |

TABLE 1-continued

|  | component | composion | MeSiO$_{3/2}$ | RSiO$_{3/2}$ | DAM (vs polysiloxane solid portion) (wt %) | ease of film formation (with eye) | modulus (Gpa) | hardness (Gpa) | dielectric constant 1 MHz | average pore size (nm) |
|---|---|---|---|---|---|---|---|---|---|---|
| Ex. 5 | Syn. Ex. 5 |  | 75 | 25 (R = n-decyl) | 2 | good | 4.1 | 0.3 | 2.4 | 15 |
| Comp. Ex. 1 | Syn. Ex. 6 |  | 100 | 0 | 2 | good | 20.1 | 1.6 | 2.7 | >100 |
| Comp. Ex. 2 | Syn. Ex. 1 |  | 0 | 100 (R = thexyl) | 0 | poor | cannot be measured | cannot be measured | cannot be measured | >100 |
| Comp. Ex. 3 | syn. Ex. 7 |  | 75 | 25 (R = isobutyl) | 2 | good | 10.8 | 0.9 | 2.6 | 13 |

\* The $(R^1)_a Si(R^2)_{4-a}$ is calculated as $(R^1)_a SiO_{(4-a)/2}$ so as to obtain the polysiloxane solid portion.
The $(R^3)_b Si(R^4)_{4-b}$ is calculated as $(R^3)_b SiO_{(4-b)/2}$ so as to obtain the polysiloxane solid portion.

TABLE 2

|  | component | compositon | MeSiO$_{3/2}$ | RSiO$_{3/2}$ | DAM (vs polysiloxane solid portion) (wt %) | oxalic acid (vs polysiloxane solid portion) (wt %) | weight-average molecular weight | | | | |
|---|---|---|---|---|---|---|---|---|---|---|---|
|  |  |  |  |  |  |  | initially | one day later | 10 days later | 30 days later | 60 days later |
| Ex. 6 | Syn. Ex. 1 |  | 0 | 100 (R = thexyl) | 2 | — | 1350 | 1350 | 1350 | 1350 | 1350 |
| Ex. 7 | Syn. Ex. 2 |  | 25 | 75 (R = thexyl) | 2 | — | 1500 | 1500 | 1600 | 1600 | 1800 |
| Comp. Ex. 4 | Syn. Ex. 1 |  | 0 | 100 (R = thexyl) | — | 1 | 1350 | 1350 | 1900 | 5800 | 24300 |
| Comp. Ex. 5 | Syn. Ex. 2 |  | 25 | 75 (R = thexyl) | — | 1 | 1500 | 3500 | 108000 | 155000 | 1179000 |

\*The $(R^1)_a Si(R^2)_{4-a}$ is calculated as $(R^1)_a SiO_{(4-a)/2}$ so as to obtain the polysiloxane solid portion..
The $(R^3)_b Si(R^4)_{4-b}$ is calculated as $(R^3)_b SiO_{(4-b)/2}$ so as to obtain the polysiloxane solid portion.

The invention claimed is:

1. A composition for forming porous film comprising:

an acid or base generator for generating acid or base by its thermal decomposition, wherein said acid or base generator is a diazo compound represented by Formula (4) or (5):

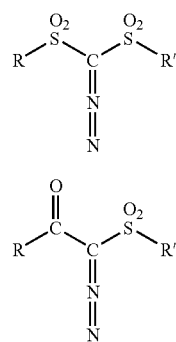

wherein R and R' each independently represents an alkyl group, an aromatic group, an aralkyl group or a fluoroalkyl group and R and R' may be same or different, and a polymer which is obtainable by hydrolyzing and condensing one or more silane compounds represented by Formula (1):

$$(R^1)_a Si(R^2)_{4-a} \quad (1)$$

wherein $R^1$ represents a straight chain or branched monovalent hydrocarbon having 6 to 20 carbons which may be substituted or unsubstituted and when there are $R^1$s, the $R^1$s each may be independently same or different; $R^2$ represents a hydrolysable group and when there are $R^2$s, the $R^2$s each may be independently same or different; and a is an integer of 1 to 3.

2. The composition for forming porous film according to claim 1 wherein decomposition temperature of said acid or base generator is lower than the decomposition temperature of $R^1$ of said polymer.

3. A composition for forming porous film comprising:

an acid or base generator for generating acid or base by its thermal decomposition, wherein said acid or base generator is a diazo compound represented Formula (4) or(5):

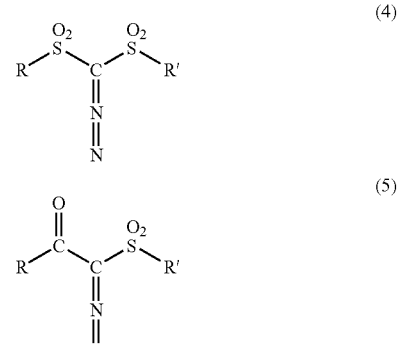

wherein R and R' each independently represents an alkyl group, an aromatic group, an aralkyl group or a fluoroalkyl group and R and R' maybe same or different, and a polymer which is obtainable by hydrolyzing and co-condensing one or more silane compounds represented by Formula (1) and one more silane compounds represented by Formula (2), Formulas (1) and (2) being:

$$(R^1)_a Si(R^2)_{4-a} \tag{1}$$

$$(R^3)_b Si(R^4)_{4-b} \tag{2}$$

wherein $R^1$ represents a straight chain or branched monovalent hydrocarbon having 6 to 20 carbons which may be substituted or unsubstituted and when there are $R^1$s, the $R^1$s each may be independently same or different; $R^2$ represents a hydrolysable group and when there are $R^2$s, the $R^2$s each may be independently same or different; and a is an integer of 1 to 3; $R^3$ represents a straight chain or branched monovalent hydrocarbon having 1 to 5 carbons which may be substituted or unsubstituted and when there are $R^3$s, the $R^3$s each may be independently same or different; $R^4$ represents a hydrolysable group and when there are $R^4$s, the $R^4$s each may be independently same or different; and b is an integer of 0 to 3.

4. The composition for forming porous film according to claim 3 wherein said polymer is a silanol group-containing hydrolysate having number-average molecular weight of 100 or more, and in said polymer 30 to 80 mol % of structural units derived from said silane compound represented by Formula (2) is represented by Formula (3):

$$Si(OH)_c(R^5)_{4-c} \tag{3}$$

wherein $R^5$ represents a siloxane residue or $R^3$, and c is an integer of 1 or 2.

5. The composition for forming porous film according to claim 2 wherein said acid or base generator has a decomposition temperature of 250° C. or less.

6. A composition for forming porous film comprising:
  an acid or base generator for generating acid or base by its thermal decomposition and
  a polymer which is obtainable by hydrolyzing and co-condensing one or more silane compounds represented by Formula (1) and one more silane compounds represented by Formula (2), Formulas (1) and (2) being:

$$(R^1)_a Si(R^2)_{1-a} \tag{1}$$

$$(R^3)_b Si(R^4)_{4-b} \tag{2}$$

wherein $R^1$ represents a straight chain or branched monovalent hydrocarbon having 6 to 20 carbons which may be substituted or unsubstituted and when there are $R^1$s, the $R^1$s each may be independently same or different; $R^2$ represents a hydrolysable group and when there are $R^2$s, the $R^2$s each may be independently same or different; and a is an integer of 1 to 3; represents a straight chain or branched monovalent hydrocarbon having to 1 to 5 carbons which may be substituted or unsubstituted and when there are $R^3$s, the $R^3$s each may be independently same or different; $R^4$ represents a hydrolysate group and when there are $R^4$s, the $R^4$s each may be independently same or different; and b is an integer of 0 to 3; and
  wherein said polymer is a silanol group-containing hydrolysate having number-average molecular weight of 100 or more, and in said polymer 30 to 80 mol % of structural units derived from said silane compound represented by Formula (2) is represented by Formula (3):

$$Si(OH)_c(R^5)_{4-c} \tag{3}$$

wherein $R^5$ represents a siloxane residue or $R^3$, and c is an integer of 1 or 2.

7. The composition for forming porous film according to claim 6, wherein the decomposition temperature of said acid or base generator is lower than the decomposition temperature of $R^1$ of said polymer.

8. The composition for forming porous film according to claim 7, wherein said acid or base generator has a decomposition temperature of 250° C.

* * * * *